US009130533B1

(12) United States Patent
Mumcu et al.

(10) Patent No.: US 9,130,533 B1
(45) Date of Patent: Sep. 8, 2015

(54) NON-DISPERSIVE MICROWAVE PHASE SHIFTERS

(71) Applicants: Gokhan Mumcu, Tampa, FL (US); Thomas McCrea Weller, Lutz, FL (US); Ibrahim Turki Nassar, Tampa, FL (US)

(72) Inventors: Gokhan Mumcu, Tampa, FL (US); Thomas McCrea Weller, Lutz, FL (US); Ibrahim Turki Nassar, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 14/096,446

(22) Filed: Dec. 4, 2013

Related U.S. Application Data

(60) Provisional application No. 61/733,108, filed on Dec. 4, 2012.

(51) Int. Cl.
*H01P 5/22* (2006.01)
*H03H 7/20* (2006.01)

(52) U.S. Cl.
CPC .................................... *H03H 7/20* (2013.01)

(58) Field of Classification Search
USPC ........................................ 333/130–152, 156
See application file for complete search history.

(56) References Cited

U.S. PATENT DOCUMENTS

| | | | | |
|---|---|---|---|---|
| 7,508,283 | B2 | 3/2009 | Itoh | |
| 7,675,384 | B2 | 3/2010 | Itoh | |
| 8,022,790 | B2 | 9/2011 | Iguchi | |
| 2010/0026416 | A1 * | 2/2010 | Ryou et al. | 333/125 |
| 2010/0283705 | A1 | 11/2010 | Achour | |
| 2011/0248793 | A1 * | 10/2011 | Kim et al. | 333/126 |
| 2013/0187828 | A1 * | 7/2013 | Desclos et al. | 343/861 |

OTHER PUBLICATIONS

Perruisseau-Carrier, et al. "Composite Right/Left-Handed Transmission Line Metamaterial Phase Shifters (MPS) in MMIC Technology", IEEE Transaction on Microwave Theory and Techniques, vol. 54, No. 4, Apr. 2006.

Kuylenstierna, et al. "Composite Right/Left Handed Transmission (CRLH) Line Phase Shifter Using Ferroelectric Varactors", IEEE Transactions on Microwave and Wireless Components, vol. 16, No. 4, Apr. 2006.

Peroulis, et al. "Electromechanical Considerations in Developing Low-Voltage RF MEMS Switches", IEEE Transactions on Microwave Theory and Techniques, vol. 51, No. 1, pp. 259-270, Jan. 2003.

Shekhar, et al., "Switching and Release Time Analysis of Electrostatically Actuated Capacitive RF MEMS Switches", Sensors and Transducers Journal, vol. 130, No. 7, pp. 77-90, Jul. 2011.

Y. J. Cheng, W. Hong, and K. Wu, "Broadband Self-Compensating Phase Shifter Combining Delay Line and Equal-Length Unequal-Width Phaser," IEEE Transactions on Microwave Theory and Techniques, vol. 58, No. 1, pp. 203-210, 2010.

Y. J. Ko, J. Y. Park, and J. U. Bu, "Integrated RF MEMS Phase Shifters with Constant Phase Shift," IEEE Microwave Theory and Techniques Symposium Proceedings, pp. 1489-1492, 2003.

J. Perruisseau-Carrier, T. Lisec, and A. K. Skrivervik, "Circuit Model and Design of Silicon-Integrated CRLH-TLs Analogically Controlled by MEMS," Microwave and Optical Technology Letters, vol. 48, No. 12, pp. 2496-2499, 2006.

J. Perruisseau-Carrier, K. Topalli, and T. Akin, "Low-Loss Ku-Band Artificial Transmission Line With MEMS Tuning Capability," IEEE Microwave and Wireless Components Letters, vol. 19, No. 6, pp. 377-379, 2009.

T. Jang, S-H. Hwang,Y-S. Bang, J-M. Kim, Y-K. Kim, C-W. Baek, and S. Lim, "Switchable Composite Right/Left-Handed (S-CRLH) Transmission Line Using MEMS Switches," IEEE Microwave and Wireless Components Letters, vol. 19, No. 12, pp. 804-806, 2009.

J.B. Muldavin and G.M. Rebeiz, "Nonlinear Electro-Mechanical Modeling of MEMS Switches," Digest of Technical Papers, 2001 IEEE MTTS International Microwave Symposium, pp. 2119-2122, 2001.

S. Duffy, C. Bozler, S. Rabe, J. Knecht, L. Travis, P. Wyatt, C. Keast, and M. Gouker, "MEMS Microswitches for Reconfigurable Microwave Circuitry," IEEE Microwave and Wireless Components Letters, vol. 11, No. 3, pp. 259-270, Mar. 2001.

* cited by examiner

*Primary Examiner* — Dinh Le
(74) *Attorney, Agent, or Firm* — Thomas | Horstemeyer, LLP

(57) ABSTRACT

In one embodiment, a non-dispersive phase shifter includes a composite right- and left-handed (CRLH) circuit that can be toggled between a first phase delay state and a second phase delay state with a substantially constant phase shift over a range of frequencies.

15 Claims, 17 Drawing Sheets

| C1 | C1s1 | C2 | C2s2 | L1 | L1s1 | L2 | L2s2 |
|---|---|---|---|---|---|---|---|
| 0.20 | 0.50 | 0.03 | 0.08 | 0.50 | 1.25 | 0.08 | 0.20 |

| L1 | L2 | L3 | L4 | C1 | C2 | C3 | C4 | Lp1 | Lp2 | Cp1 | Cp2 | Cp3 | Cp4 | Cb |
|---|---|---|---|---|---|---|---|---|---|---|---|---|---|---|
| 0.155 | 0.46 | 0.1 | 1.23 | 0.24 | 0.045 | 0.6 | 0.076 | 0.08 | 0.17 | 0.0025 | 0.013 | 0.03 | 0.01 | 3 |

NON-DISPERSIVE MICROWAVE PHASE SHIFTERS

CROSS-REFERENCE TO RELATED APPLICATION(S)

This application claims priority to U.S. Provisional Application Ser. No. 61/733,108, filed Dec. 4, 2012, which is hereby incorporated by reference herein in its entirety.

NOTICE OF GOVERNMENT-SPONSORED RESEARCH

This invention was made with Government support under grant/contract number FA8650-12-M-1389, awarded by the Department of Defense (DOD). The Government has certain rights in the invention.

BACKGROUND

Microwave phase shifters are radio frequency (RF) circuit networks that are used to introduce variable phase delays to RF signals. Their most important application is phased array systems that are typically constructed as one-dimensional or two-dimensional periodic arrangements of multiple individual antenna elements integrated with microwave phase shifters. These systems can electronically steer the direction of maximum or minimum radiation by utilizing the phase shifters to adjust the phase delays between the waves emitted from the individual antenna elements. Therefore, microwave phase shifters play a key role for the cost, efficiency, gain, and bandwidth performance of such phased array systems.

A significant problem related to the design of microwave phase shifters is achieving designs that can provide a constant phase shift over a broad frequency range while maintaining excellent impedance match in each state of the phase shifter. In addition, maintaining the component size and keeping its insertion loss low are also design challenges.

BRIEF DESCRIPTION OF THE DRAWINGS

The present disclosure may be better understood with reference to the following figures. Matching reference numerals designate corresponding parts throughout the figures, which are not necessarily drawn to scale.

DETAILED DESCRIPTION

As described above, a significant problem related to the design of microwave phase shifters is achieving designs that can provide a constant phase shift over a broad frequency range while maintaining excellent impedance match in all states of the phase shifter. Disclosed herein are microwave phase shifters that provide a substantially constant phase shift while also achieving a very small footprint and low insertion loss. In some embodiments, the operational and design principles of the phase shifters are based on lumped circuit models that provide dispersion properties of composite right- and left-handed transmission lines (also referred to as CRLH metamaterials). The phase shifting is accomplished by switching from a first (e.g., low) phase delay state to a second (e.g., high) phase delay state in a manner in which both the inductances and capacitances of the phase shifter circuit are simultaneously changed.

In the following disclosure, various specific embodiments are described. It is to be understood that those embodiments are example implementations of the disclosed inventions and that alternative embodiments are possible. All such embodiments are intended to fall within the scope of this disclosure.

Engineered metamaterials are often constructed from periodic arrangements of ordinary materials or circuit components and exhibit unique electromagnetic properties that are not found in any of their individual constituents. An important application of such structures is RF circuit miniaturization as their dispersion (K-ω) diagrams can be tailored to reduce phase velocity or even reverse it in some frequency regions. In this context, CRLH metamaterials have drawn strong interest because their unit cells can be conveniently constructed from reactively loaded microstrip line segments.

Figure 1A:
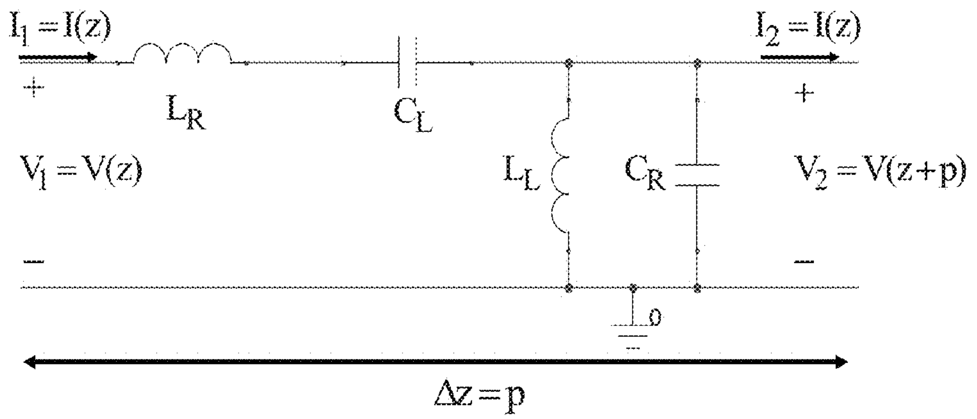
FIG. 1A is a lumped element circuit model of an embodiment of a balanced CRLH unit cell.
Figure 1B:
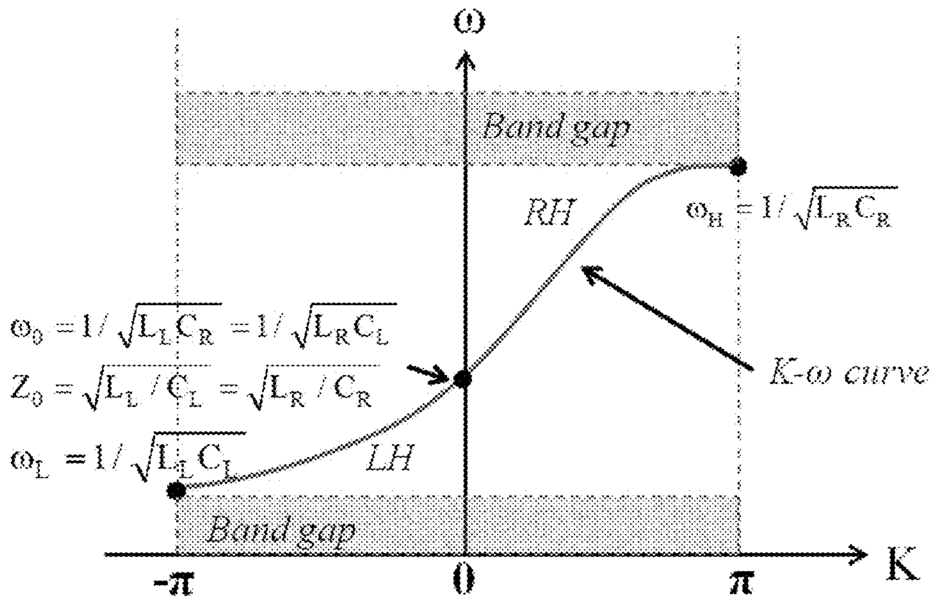
FIG. 1B is a representative dispersion diagram for the CRLH unit cell of FIG. 1A.

FIGS. 1A and 1B respectively depict a general lumped element circuit model of a balanced CRLH unit cell and its representative dispersion (K-ω) diagram. The circuit model comprises a conventional transmission line TL that includes a series inductor $L_R$ and a shunt capacitor $C_R$. A series capacitor $C_L$ and shunt inductor $L_L$ are added to the circuit to generate a frequency region capable of supporting backward waves with opposite group and phase velocities (i.e., left-handed propagation). The unit cell is essentially a band-pass circuit with lower and higher cut-off frequencies that are determined by the products of the left-handed ($L_L$, $C_L$) and right-handed ($L_R$, $C_R$) loads, respectively. As demonstrated in FIG. 1B, the transition from left-handed to right-handed (i.e., parallel phase and group velocity) frequency bands can be accomplished without observing a band gap around the K=0 frequency ($\omega_0$) when the CRLH unit cell is designed to be "balanced" by satisfying the ratio $L_L C_R = L_R C_L$. In such a balanced CRLH configuration, the Bloch impedance (i.e., characteristic impedance if Δz=p is a small fraction of wavelength) is simply given by the ratio $(L_R/C_R)^{1/2}=(L_L/C_L)^{1/2}$ at K=0 and can be matched to a conventional TL over a broad range of frequencies. Due to the inclusion of the left-handed loads, practical implementations of CRLH unit cells can deliver K=0 phase delay with a much smaller physical size as compared to the conventional TL configurations that require a delay line with K=27 phase shift. Consequently, various phase delays can be realized with miniature structures within the vicinity of $\omega_0$ to design compact phase shifters and resonant antennas.

Figure 2A:
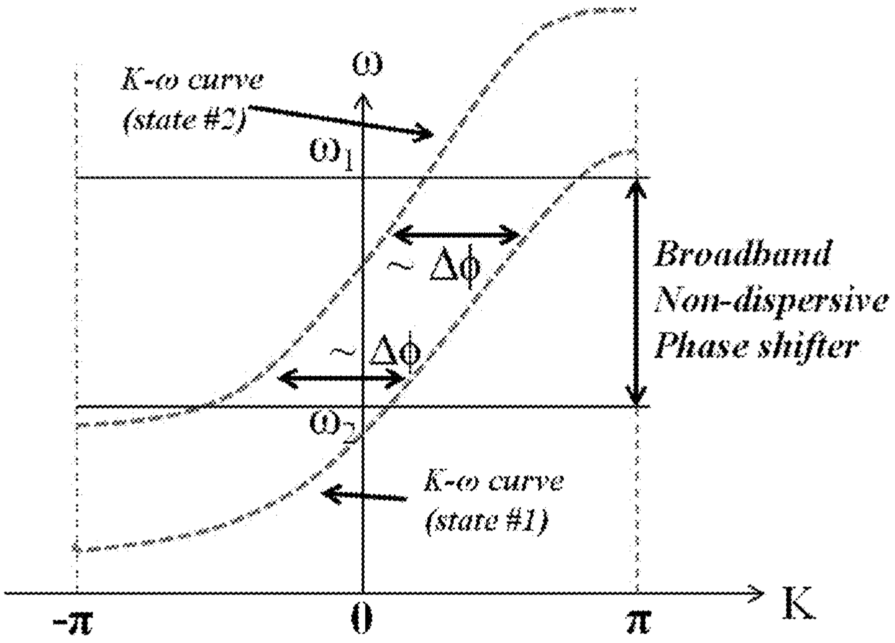
FIG. 2A is a representative K-ω diagram of a balanced CRLH unit cell when switched from a State 1 to a State 2 by simultaneously modifying all of the unit cell parameters $L_R$, $C_L$, $L_L$, and $C_R$.
Figure 2B:
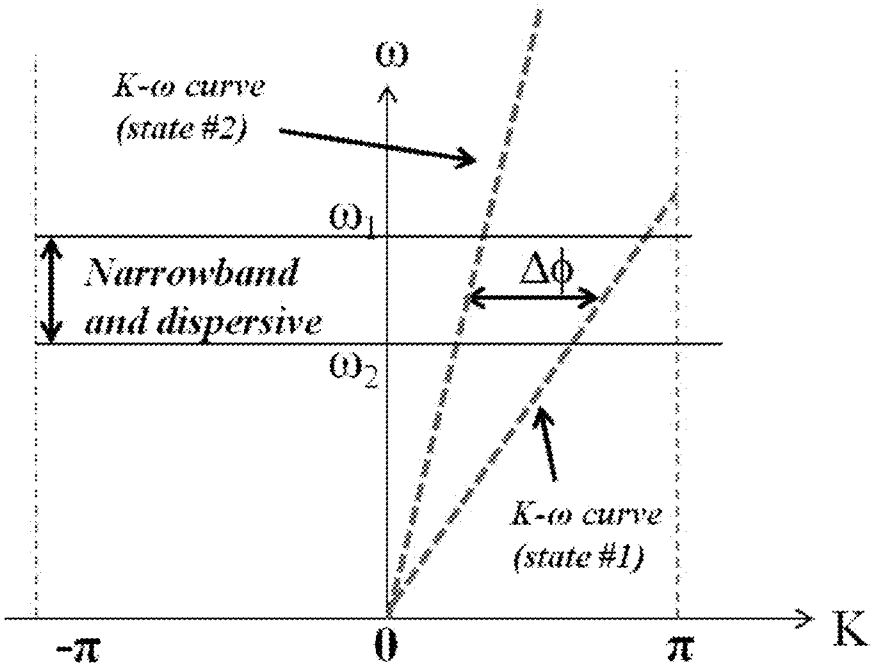
FIG. 2B (PRIOR ART)
FIG. 2B is a representative K-ω diagram of a conventional slow-wave based phase shifter.

For tunable phase shifter applications, the CRLH unit cell presents a unique design opportunity to maintain a broadband constant phase difference between different circuit states. To demonstrate this concept, FIG. 2A presents a representative dispersion diagram of a two-state phase shifter implemented with CRLH unit cells. The phase shifter is switched from States 1 to 2 by simultaneously varying all values (i.e., L and C) of the series and shunt circuit components. As such, the circuit parameters of State 2 are optimized to maintain a near-identical slope to that of State 1 over a broad frequency band while attaining the same characteristic impedance to provide equal return loss performance. Because of the nearly identical slopes, the phase difference Δϕ between the two states is nearly constant over a wide frequency range, essentially providing a broadband non-dispersive microwave phase shifter. On the other hand, as depicted in FIG. 2B, conventional slow-wave structures fail to provide constant phase variation Δϕ due to the swift variation in K-ω slope as the phase shifting state is changed, thereby resulting in a dispersive microwave phase shifter.

Recently, techniques have been proposed to develop broadband non-dispersive (or self-compensating) phase shifters. In one such technique, a conventional delay line was combined with an unequal-width, equal-length line to achieve a 49% bandwidth around 30 GHz. However, the presence of conventional delay lines makes the length of the structure considerably large (~7 mm) for a 45° phase shifter. In another case, a phase shifter topology was proposed that combines open and short-ended stubs, but the phase variation and impedance matching performances were degraded. More recently, it has been proposed to use CRLH unit cells integrated with MEMS switches to realize broadband phase shifters. Nevertheless, all these studies have been limited to varying only the value of the series capacitance $C_L$, thereby resulting in narrow band components.

The disclosed phase shifters alleviate the above issues by integrating the CRLH unit cells with MEMS capacitors to enable simultaneous tuning of all the capacitive and inductive loads. The disclosed phase shifters are the first truly miniature, broadband, impedance-matched, and non-dispersive phase shifters that operate at microwave frequencies. Described below are examples of such phase shifters that are specifically designed for the Ka-band. It is noted, however, that this band is cited only as an example and that the disclosed phase shifters are not limited to that band.

Figure 3:
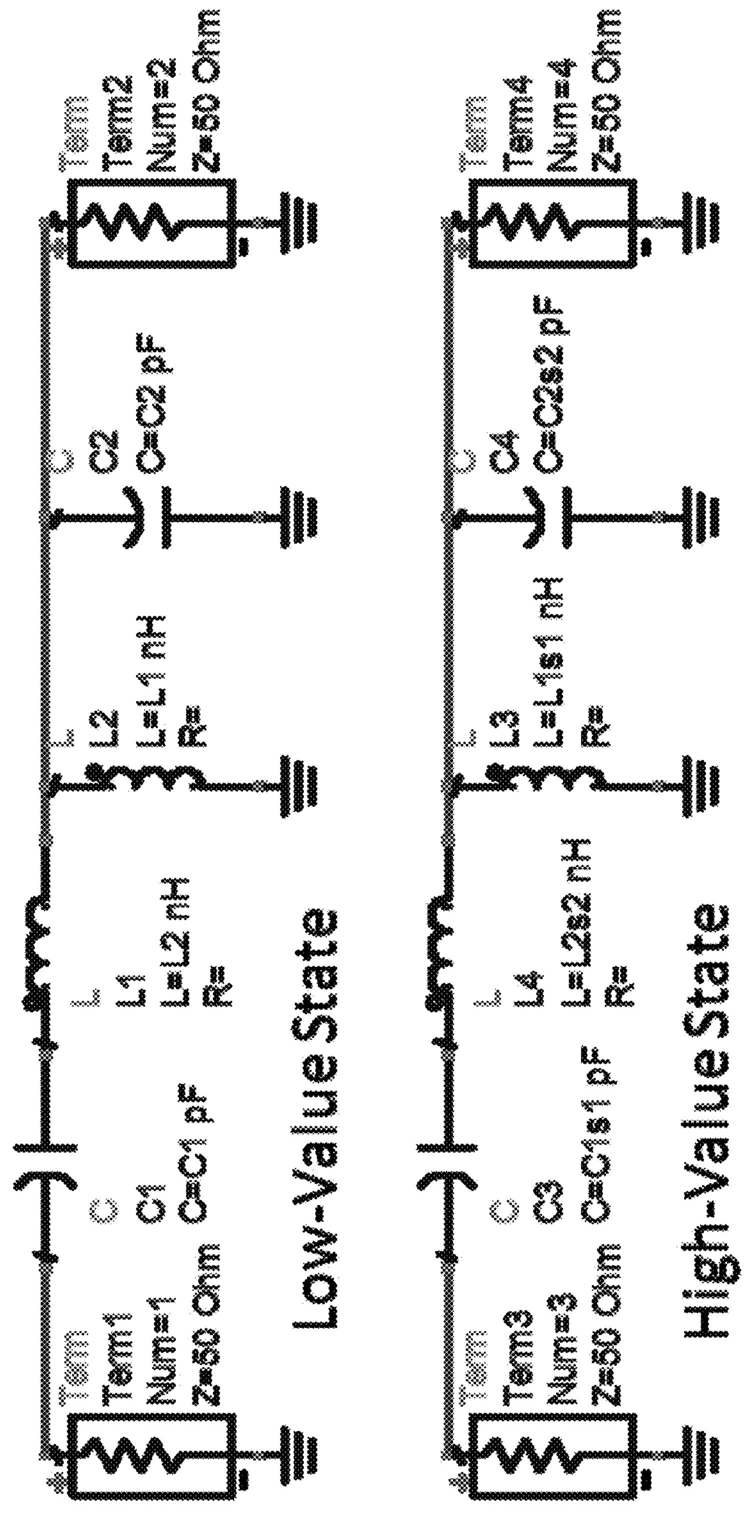
FIG. 3 is a lumped element circuit model of an embodiment of a non-dispersive CRLH unit cell that acts as a 45° phase shifter in a low-value state (top) and a high-value state (bottom).

FIG. 3 illustrates an Advanced Design Systems (ADS) lumped element circuit model of an ideal non-dispersive CRLH unit cell optimized to operate as a 45° phase shifter from 20 to 30 GHz with minimal phase variation and good impedance match. The low-value state is shown in the top of the figure and the high-value state is shown in the bottom of the figure. Element values for the various components of the circuit (in both the low and high states) are given a table beneath the circuit model in units of pF and nH.

A particular goal of the optimization of the CRLH unit cell of FIG. 3 was to keep the return loss well above 20 dB in the 24.5 to 27 GHz band (as was requested in a proposal solicitation). As mentioned above, each state (State 1 being the low value and State 2 being the high value) is provided using a series LC-shunt LC circuit in which the high-pass (C1-L1, LH parameters) and low-pass (L2-C2, RH parameters) responses are embedded. In the optimized 45° unit cell of FIG. 3, each element in the high-value state circuit is 2.5× the value of the corresponding element in the low-value state. This exact ratio resulted from the stringent constraint placed on each LC pair to satisfy the property $(L_x/C_x)^{0.5}=50$ so that a good impedance match in both states can be maintained.

Figure 4A:
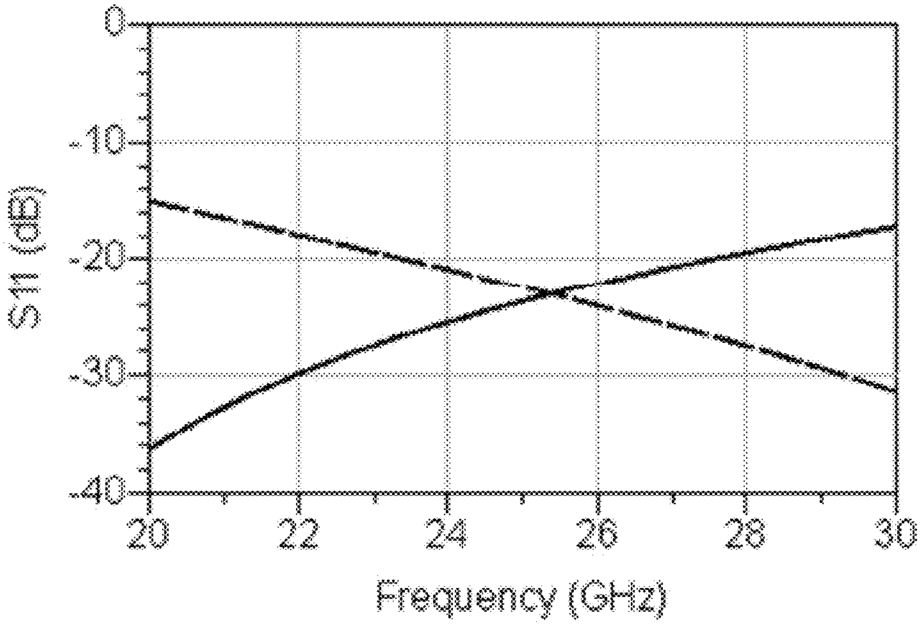
FIG. 4A is a graph of simulated $S_{11}$ performance for the low- and high-value states of the 45° phase shifter of FIG. 3.
Figure 4B:
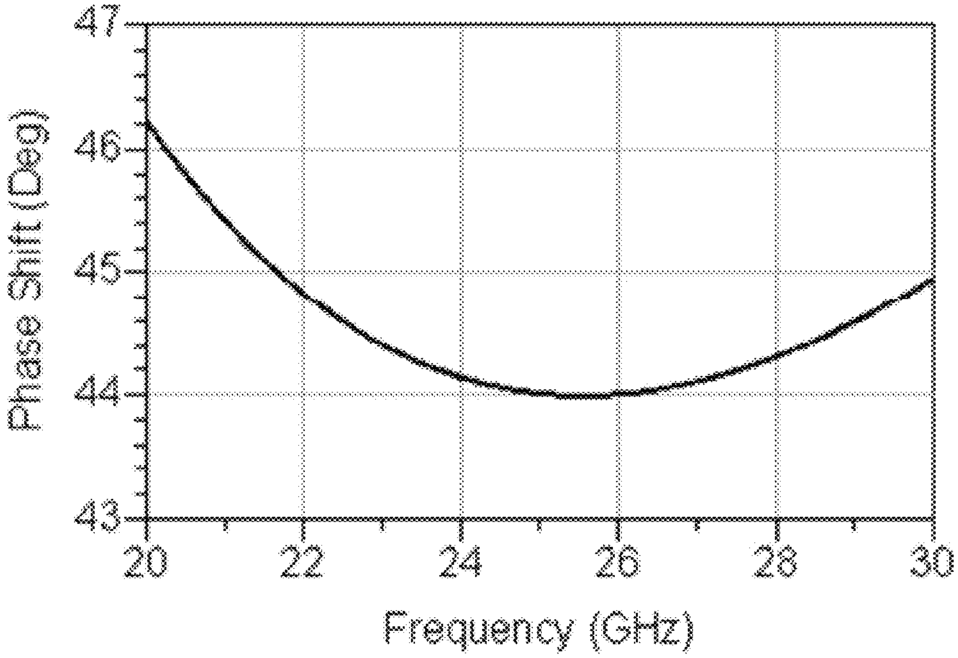
FIG. 4B is a graph of simulated phase shift performance for the low- and high-value states of the 45° phase shifter of FIG. 3.

The simulated reflection coefficient $S_{11}$ and phase shift in the 20 to 30 GHz band for the CRLH unit cell of FIG. 3 are respectively shown in FIGS. 4A and 4B. These figures indicate a greater than 20 dB return loss from 24.5 to 27 GHz with a phase variation of approximately ±0.1°. This suggests that a greater than 90° phase shift can also be achieved from the presented equivalent circuit while maintaining a return loss greater than 20 dB in both states. It is also important to note that the example 45° CRLH unit cell can operate with greater than approximately ±1° phase variation over a very wide frequency range (i.e., 20 to 30 GHz) if the constraint on the return loss is relaxed to 15 dB. Similarly, relaxing the constraint on phase variation to (e.g.)<±2.5° can enable greater than a 20 dB return loss over a much broader frequency range.

As described above, the CRLH unit cell comprises two LC sections (series and shunt), each of which having two states depending on the desired state of the phase shifter. There are multiple ways in which the low-value and high-value states of the unit cell can be realized. In a first approach, separate and complete low- and high-value circuits (as illustrated in FIG. 3) can be used that are selected using a switch, such as a single-pull, double-throw (SPDT) RF MEM switch, at each end. In a second approach, a single series LC section that is switchable between two states can be combined with separate and complete shunt LC sections that are selected for each state (or the complement of this approach with separate series LC sections and a single, switchable shunt LC section). In a third approach, single series and shunt LC sections, each of which is switchable between two states, can be used.

Examples of the first and third approaches are detailed below. Of the three approaches, the third approach typically provides the design with the smallest footprint. The first and second approaches are straightforward modifications of the third approach and can be more advantageous depending on the design rules established by the manufacturers.

Figure 5B:
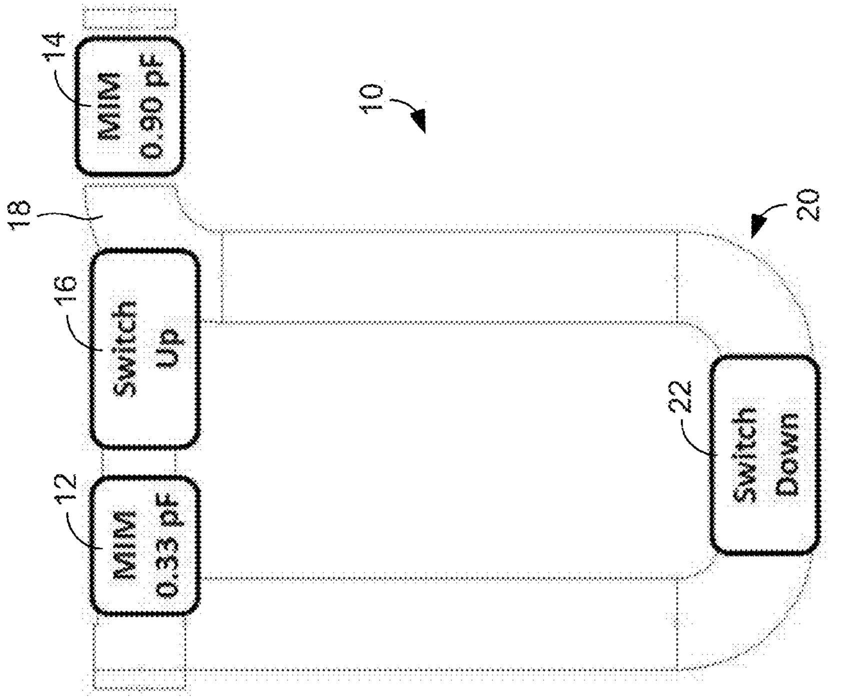
FIGS. 5A and 5B illustrate a circuit layout for an embodiment of a switchable series LC section in low-value and high-value states, respectively.
Figure 5A:
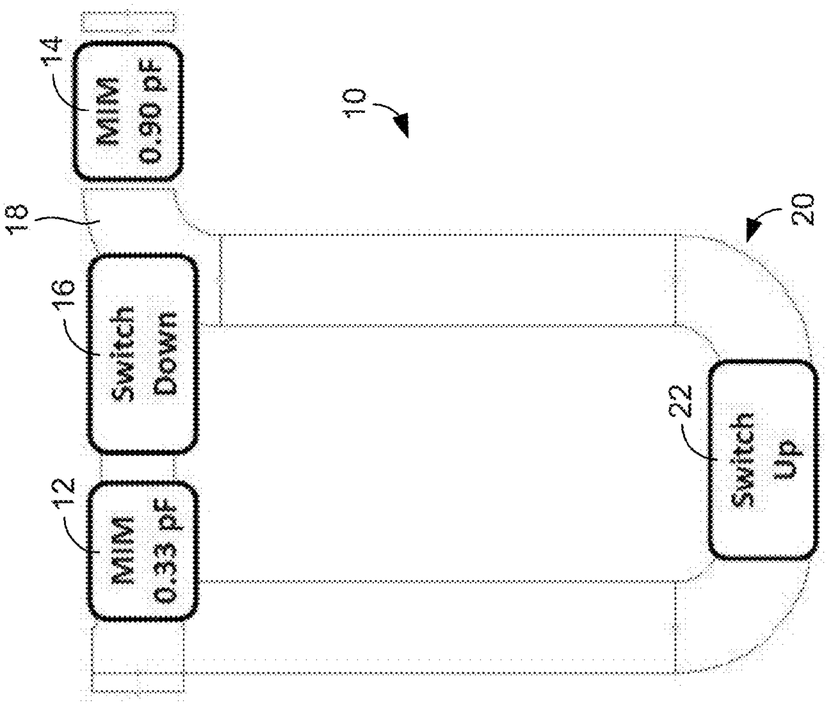

The miniature series LC section of the phase shifter circuit can be realized using lumped capacitors (metal-insulator-metal (MIM) or interdigital) and short sections of transmission line (t-line) to provide the necessary inductance. An example microstrip series LC section circuit 10 is shown in FIGS. 5A and 5B, which illustrate the low-value state and the high-value state, respectively. In the low-value state shown in FIG. 5A, the RF signal travels across the top of the structure through the series combination of first and second MIM capacitors 12 and 14 (net capacitance value of 0.2 pF), a first MEMS switch 16, and the short t-line section 18 (0.08 nH). In the high-value state shown in FIG. 5B, however, RF signal travels through a lower loop 20 (0.2 nH) of the circuit 10, a second MEMS switch 22, and only the second MIM capacitor 14 (net capacitance of 0.5 pF). The MEMS switches 16 and 22 are used to toggle the circuit 10 between the two states. A simulation of the circuit 10 was performed using parasitic models for the capacitors 12, 14 and transmission lines, as well as for the MEMS switches 16, 22 (1.0 pF with 0.15 dB insertion loss in the down-state and 0.01 pF in the up-state). The total footprint for the switchable series LC section circuit 10 was approximately 200×200 μm$^2$. The contact areas of the employed MEMS switches 16, 22 were chosen to be in the range of 50×50 μm$^2$ to 70×70 μm$^2$ for the mechanical modeling and switching time simulations.

Figure 6:
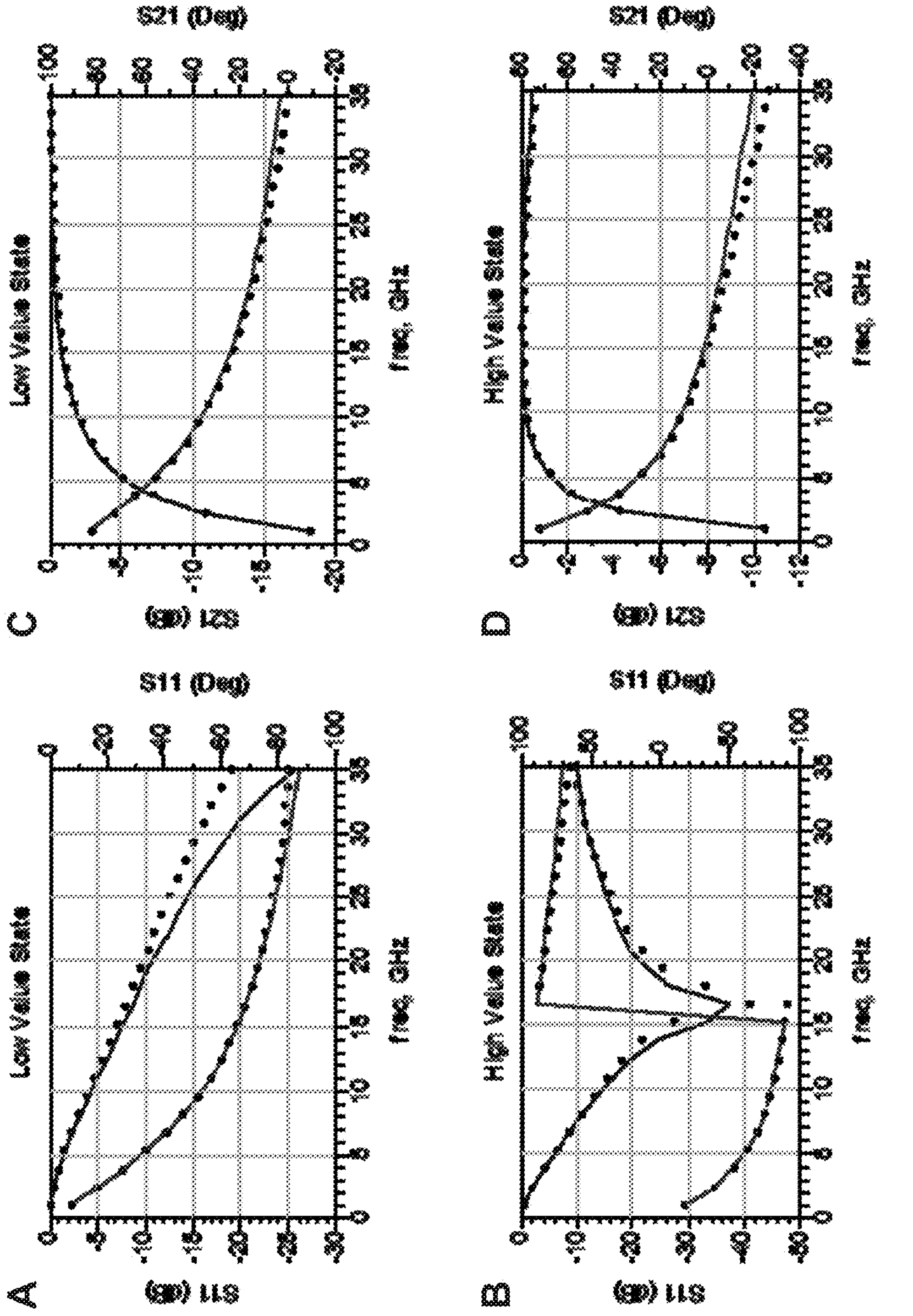
FIGS. 6A-6D are graphs that show the simulated $S_{11}$ performance for the low- and high-value states (6A and 6B respectively) and the simulated $S_{21}$ performance for the low- and high-value states (6C and 6D respectively) for the circuits of FIG. 3 and FIG. 5.

A performance comparison between the ideal circuit of FIG. 3 and the circuit layout shown in FIGS. 5A and 5B is provided in FIGS. 6A-6D. More particularly, FIGS. 6A and 6B show the simulated $S_{11}$ performance for the low- and high-value states for the circuits (FIG. 3 circuit in solid lines; FIG. 5 circuit in dotted lines), respectively, while FIGS. 6C and 6D show the simulated $S_{21}$ performance for the low- and high-value states for the circuits (FIG. 3 circuit in solid lines; FIG. 5 circuit in dotted lines), respectively. These graphs show excellent agreement between the two circuits.

Figure 7A:
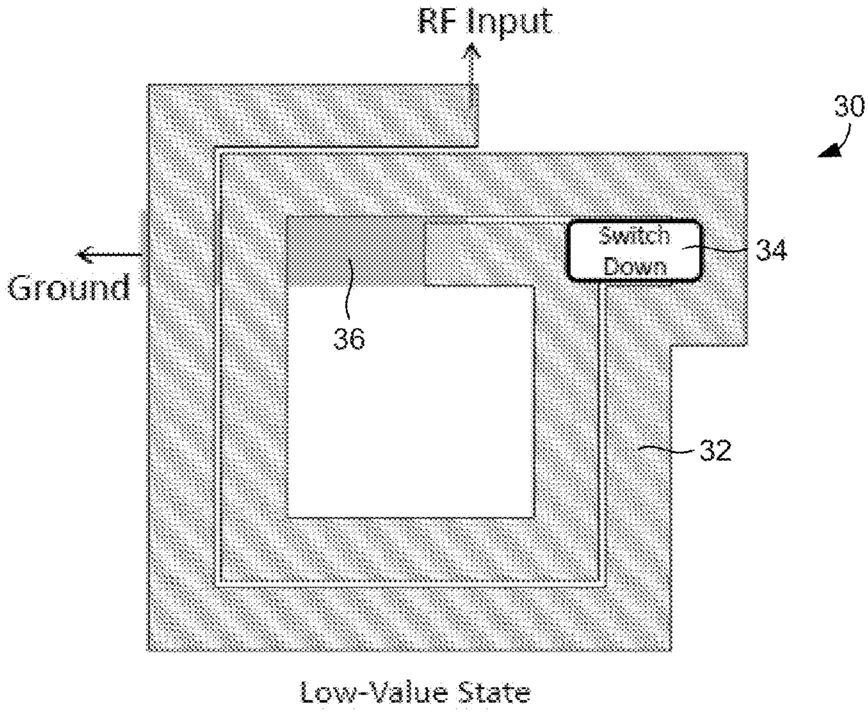
FIGS. 7A and 7B illustrate a circuit layout for an embodiment of a switchable shunt LC section in low-value and high-value states, respectively.
Figure 7B:
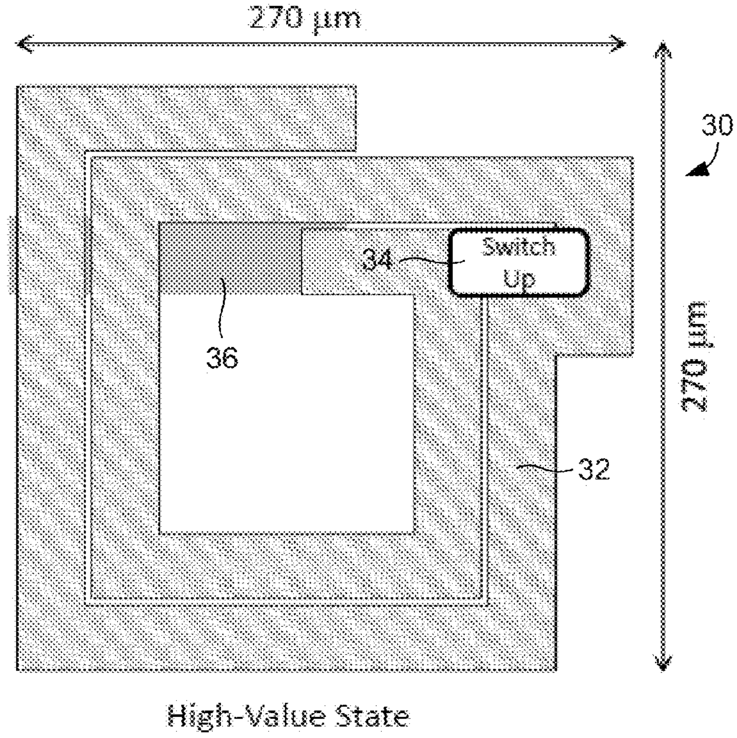

The miniature shunt LC section of the phase shifter circuit can be realized using a spiral inductor, with the intrinsic shunt capacitance from the spiral combined with additional discrete capacitors in order to obtain the required LC combination. An example microstrip shunt LC section circuit 30 is shown in FIGS. 7A and 7B, which illustrate the low-value state and the high-value state, respectively. As shown in these figures, the circuit 30 comprises a spiral trace 32 and a MEMS switch 34. In the high-value state shown in FIG. 7B, the circuit 30 behaves as a conventional spiral inductor, with the RF signal traversing the entire spiral trace 32 and exiting through a bridge 36. In the low-value state shown in FIG. 7B, however, the MEMS switch 34 is closed and provides a shorter path to the center of the spiral trace 32, effectively reducing the total inductance and capacitance of the section. A simulation for the layout model was performed using numerical electromagnetic simulation to capture all coupling effects.

Back-etching of the silicon beneath the spiral 32 (~100 μm cavity depth) was assumed in order to minimize parasitic capacitance to ground. The total footprint for the shunt LC section circuit 30 was approximately 270×270 μm$^2$. Based on the overall footprint, switches with contact areas in the range of 50×50 μm$^2$ to 70×70 μm$^2$ can be used to satisfy the needed performance metrics, such as the switching speed.

Figure 8:
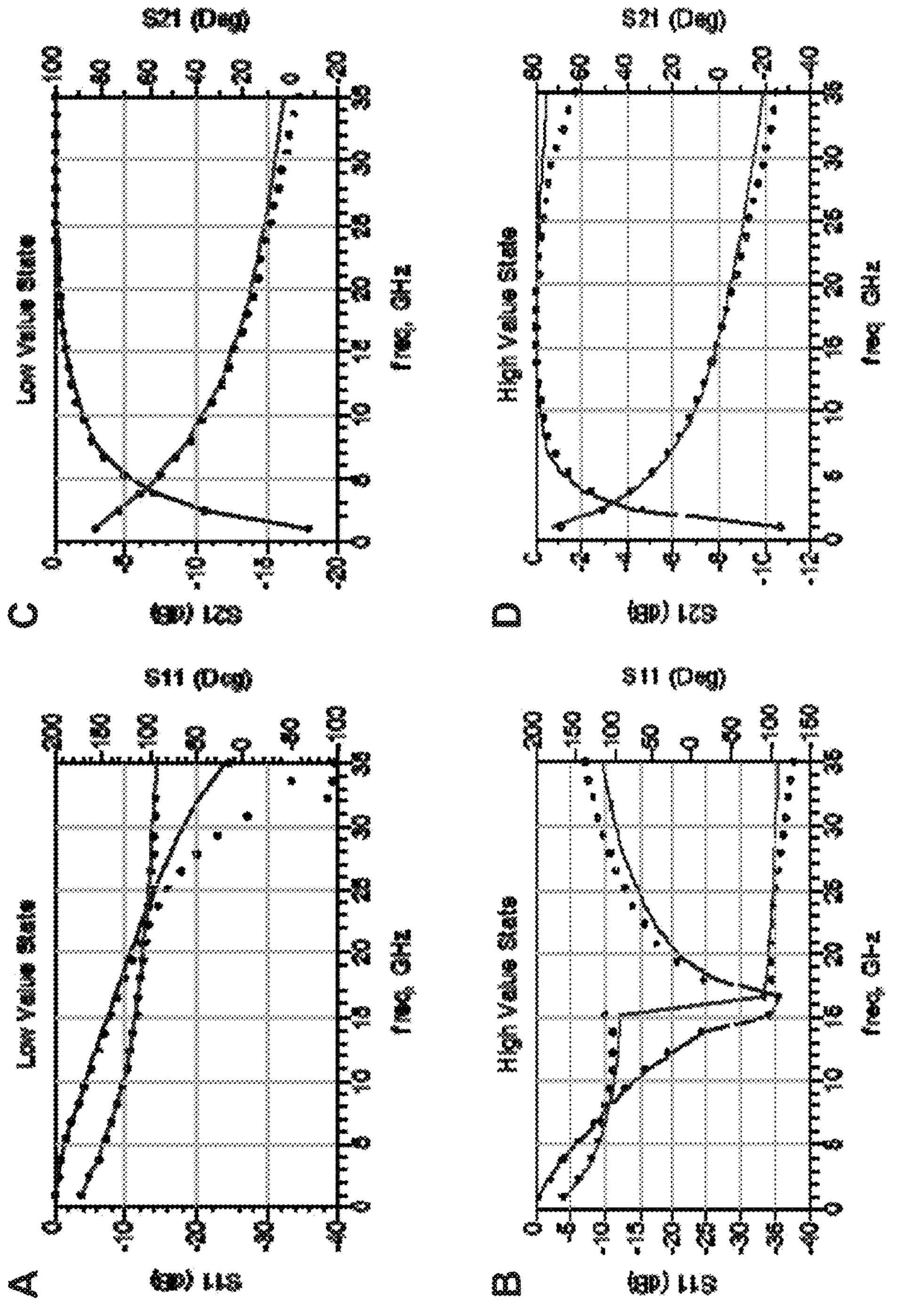
FIGS. 8A-8D are graphs that show the simulated $S_{11}$ performance for the low- and high-value states (8A and 8B respectively) and the simulated $S_{21}$ performance for the low- and high-value states (8C and 8D respectively) for the circuits of FIG. 3 and FIG. 7.

A comparison to the ideal circuit of FIG. 3 and the circuit layout shown in FIGS. 7A and 7B is provided in FIGS. 8A-8D. More particularly, FIGS. 8A and 8B show the simulated $S_{11}$ performance for the low- and high-value states for the circuits (FIG. 3 circuit in solid lines; FIG. 5 circuit in dotted lines), respectively, while FIGS. 8C and 8D show the simulated $S_{21}$ performance for the low- and high-value states for the circuits (FIG. 3 circuit in solid lines; FIG. 5 circuit in dotted lines), respectively.

Figure 9:
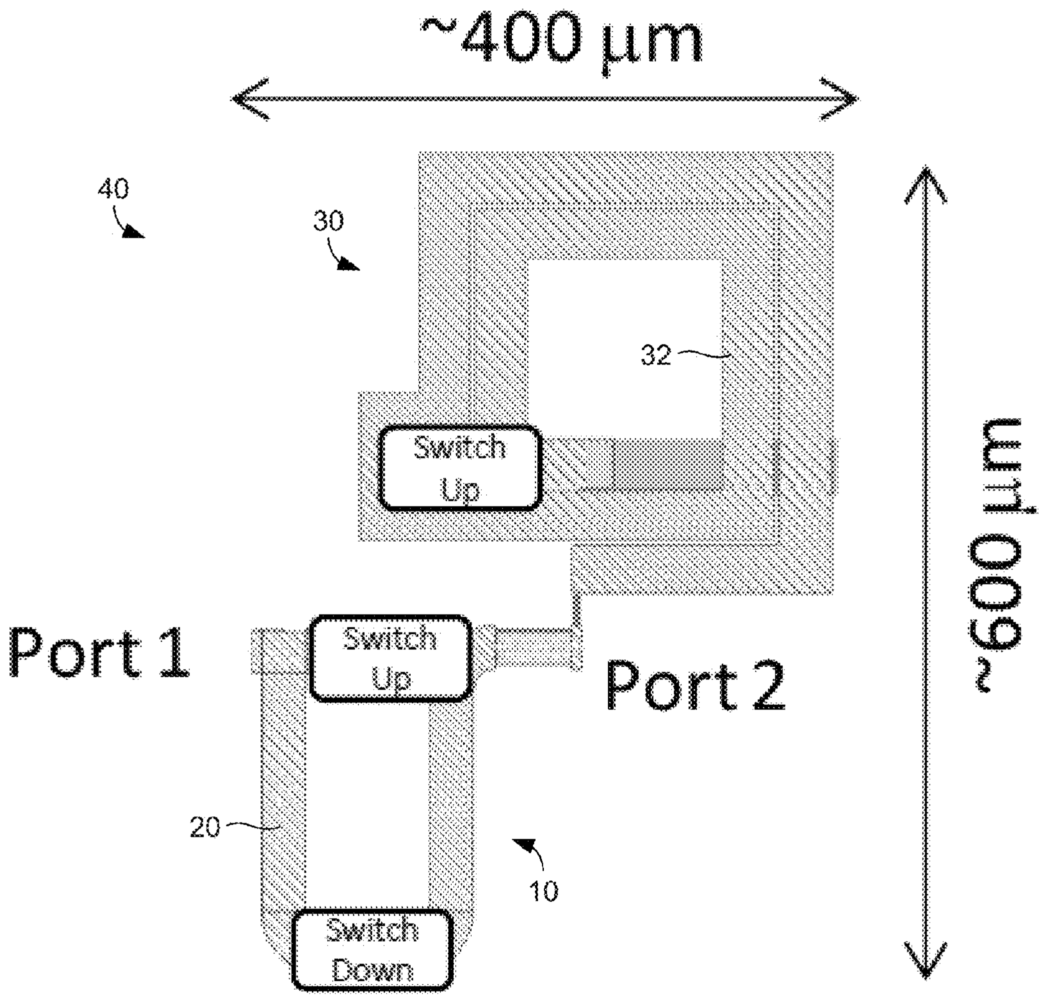
FIG. 9 illustrates an embodiment of a series-shunt LC circuit that combines the sections of FIGS. 5 and 7.
Figure 10A:
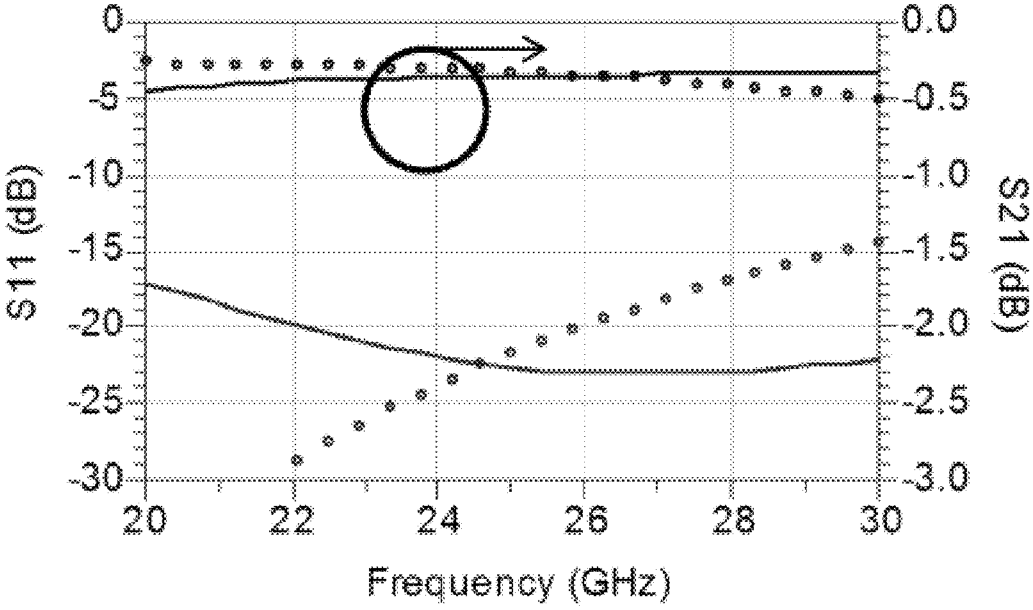
FIG. 10A is a graph of simulated $S_{11}$ performance for the low-value (solid lines) and high-value (dotted lines) states of the circuit of FIG. 9.
Figure 10B:
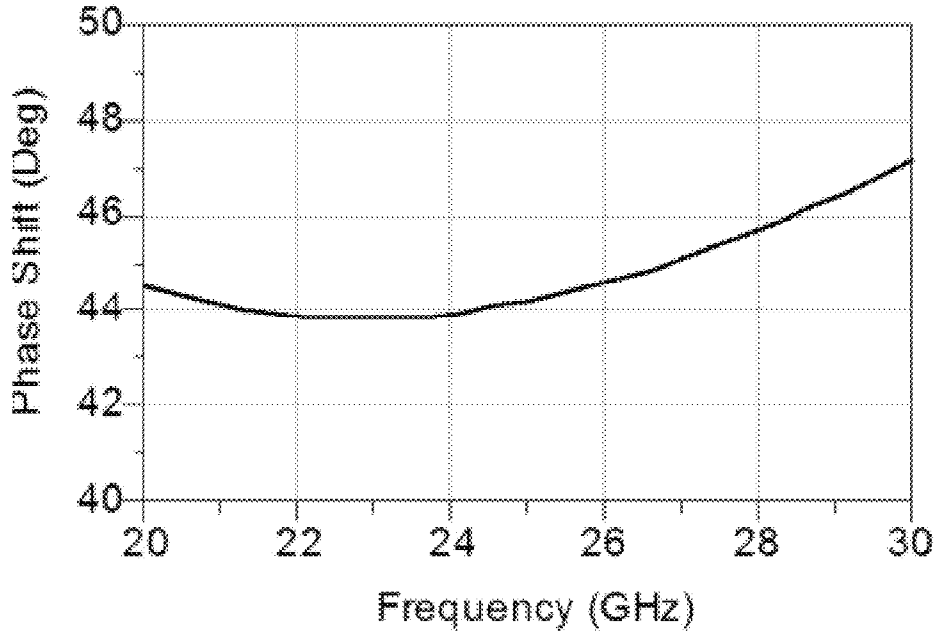
FIG. 10B is a graph of simulated phase shift performance for the circuit of FIG. 9.

FIG. 9 illustrates the combined series-shunt LC section circuit 40, which combines the circuit 10 shown in FIG. 5 and the circuit 30 shown in FIG. 7 and can be used as a 45° phase shifter. Assuming the dimensions identified above, the overall footprint of the circuit 40 is approximately 0.4×0.6 mm$^2$. The simulated performance of the circuit is provided in FIGS. 10A and 10B, which show the simulated reflection coefficient $S_{11}$ and phase shift, respectively. The return loss in the low-value state is greater than 20 dB across the 24.5 to 27 GHz range, while further optimization of the shunt LC (spiral 32) in the high-value state can be performed to fully comply with the return loss specification. The worst-case insertion loss predicted in the desired frequency band is approximately 0.35 dB. The variation in the phase shift is approximately ±0.5°.

A 4-bit (22.5°, 45°, 90°, and 180°) phase shifter can be realized by cascading multiple series LC-shunt LC sections. Circuit analysis using ideal equivalent circuit representations has been performed to determine the expected number of sections that are required for each bit, enforcing the conditions of greater than 20 dB return loss and less than ±1° variation about the nominal phase shift in the 24.5 to 27 GHz band. Like the 45° bit described above, a single series/shunt section is needed for the 22.5° bit. By reversing the order of the series and shunt combinations in selected sections and combining elements that are in series or parallel, the 90° and 180° bits can be realized using 1.5 and 2 series/shunt sections, respectively.

Figure 11:
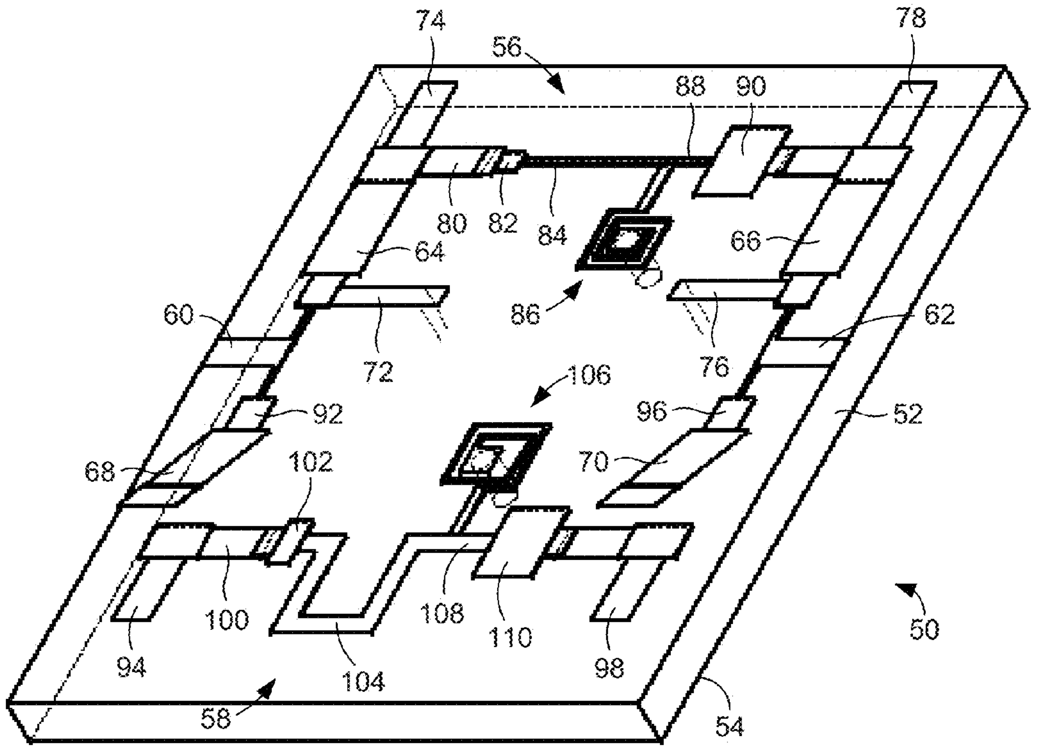
FIG. 11 illustrates an embodiment of a series-shunt LC circuit that can be used as a phase shifter.

FIG. 11 illustrates an example series-shunt LC section circuit 50 that can be used as one of the bits of a 4-bit phase shifter. As shown in FIG. 11, the circuit 50 is formed on a top surface of a substrate 52 that includes a ground plane 54. Generally speaking, the circuit 50 includes a top path 56 that can be used in the low-value state and a bottom path 58 that can be used in the high-value state. An RF signal can be input into the circuit 50 on an input line 60 and output from the circuit 50 using an output line 62. The path along which the signal travels depends upon the states of switches within the circuit 50. When first and second switches 64 and 66 of the top path 56 are closed and third and fourth switches 68 and 70 of the bottom path 58 are open, as shown in FIG. 11, the signal travels along the top path 56. However, when the first and second switches 64, 66 are open and the third and fourth switches 68, 70 are closed, the signal travels along the bottom path 58.

The top path 56 includes a first bias network (comprising traces 72 and 74) that is used to actuate the first switch 64 and a second bias network (comprising the traces 76 and 78) that is used to actuate the second switch 66. Between the two switches 64, 66 are the components that form the series-shunt LC section of the top path 56. These components are represented in the top lumped element circuit model of FIG. 12. Connected to the first switch 64 is a trace 80 that is represented by the inductor $L_1$ and capacitor $C_{p1}$ shown in the circuit model of FIG. 12. Coupled to the trace 80 is a capacitor 82, which is represented by the capacitor $C_1$ in the circuit model of FIG. 12. Connected to the capacitor 82 by a further trace 84 is a spiral 86, which is represented by the parallel inductor $L_2$ and capacitor $C_2$ in the circuit model of FIG. 12.

Figure 12:
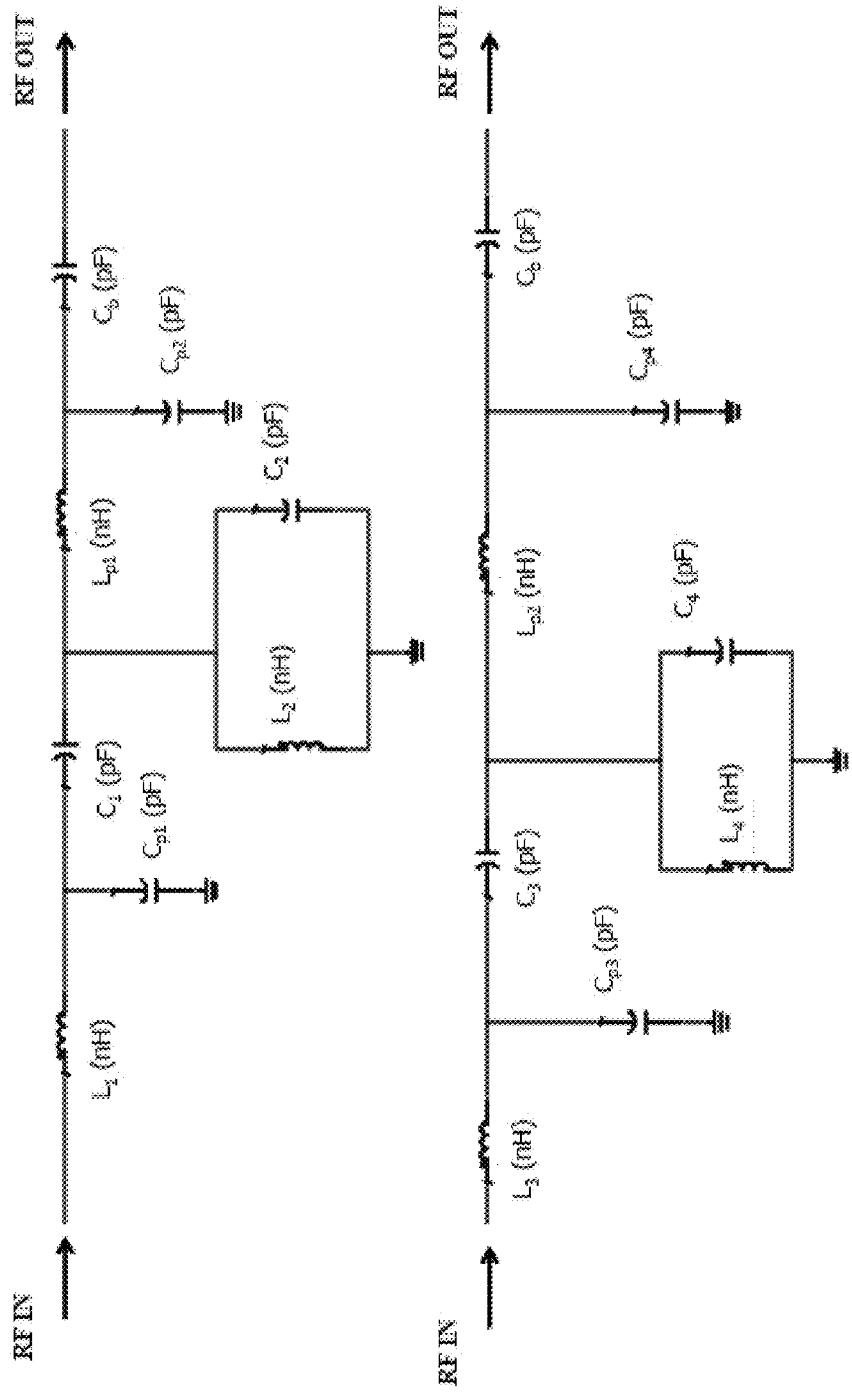
FIG. 12 is an equivalent circuit model for the phase shifter layout of FIG. 11.

Extending from the spiral 86 is a further trace 88, which is represented by the inductor $L_{p1}$ and the capacitor $C_{p1}$ in the circuit model of FIG. 12. Finally, the top path 56 includes a further capacitor 90 that is represented by the capacitor $C_b$ in the circuit model of FIG. 12.

The bottom path 58 is similar to the top path 56. Accordingly, the bottom path 58 includes a first bias network (comprising traces 92 and 94) that is used to actuate the third switch 68 and a second bias network (comprising the traces 96 and 98) that is used to actuate the fourth switch 70. Between the two switches 68, 70 are the components that form the series-shunt LC section of the bottom path 58, which are represented in the bottom lumped element circuit model of FIG. 12. Connected to the third switch 68 is a trace 100 that is represented by the inductor $L_3$ and capacitor $C_{p3}$ shown in the circuit model of FIG. 12. Coupled to the trace 100 is a capacitor 102, which is represented by the capacitor $C_3$ in the circuit model of FIG. 12. Connected to the capacitor 102 with a further trace 104 is a spiral 106, which is presented by the parallel inductor $L_4$ and capacitor $C_4$ in the circuit model of FIG. 12. Extending from the spiral 106 is a further trace 108, which is represented by the inductor $L_{p2}$ and the capacitor $C_0$ in the circuit model of FIG. 12. Finally, the top path 58 includes a further capacitor 110 that is represented by the capacitor $C_b$ in the circuit model of FIG. 12.

Example values for each of the above-identified components of the top and bottom paths 56, 58 when the circuit is optimized as a 45° phase shifter are shown in the table included in FIG. 12.

Figure 13:
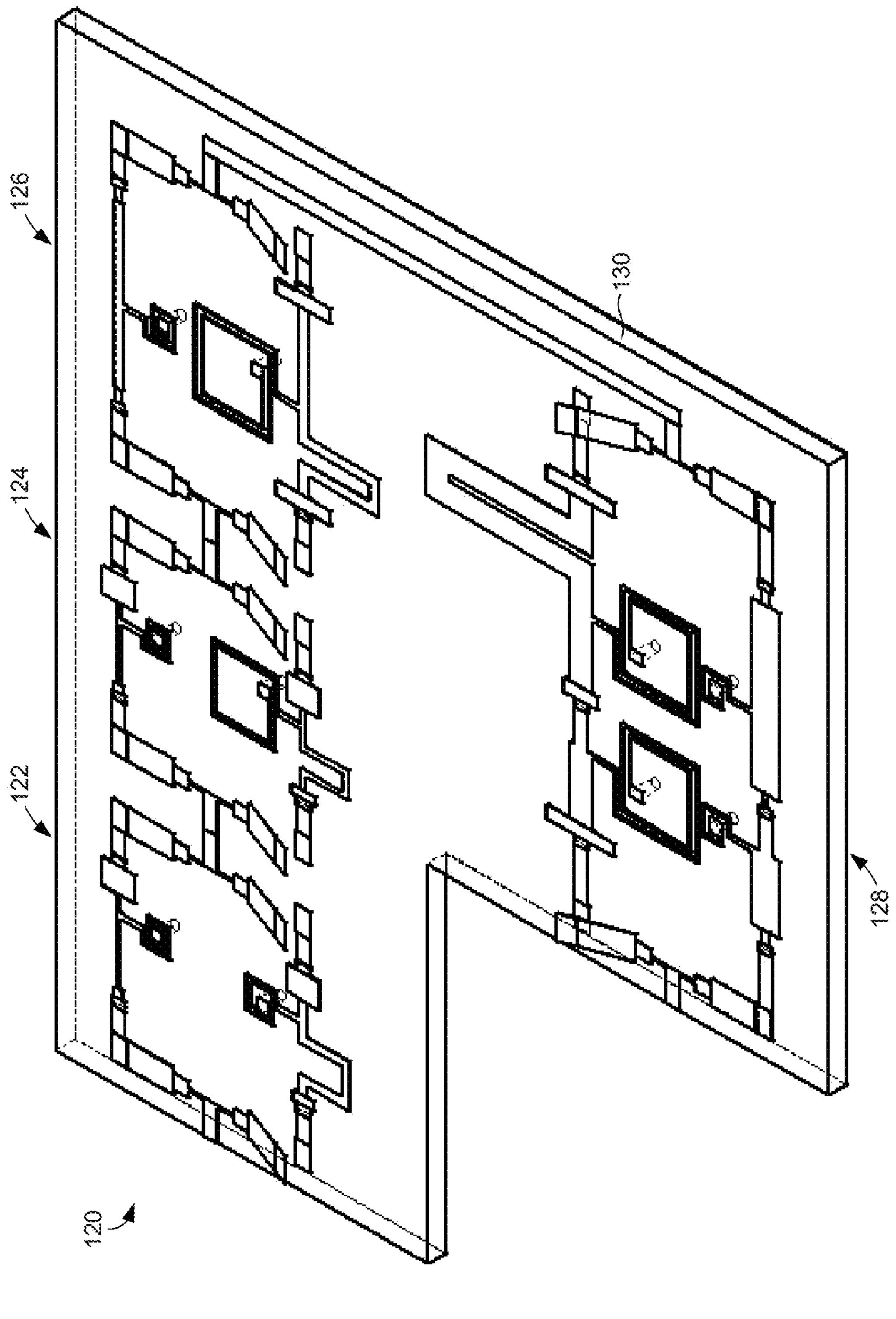
FIG. 13 is an embodiment of a 4-bit phase shifter that includes multiple series-shunt LC circuits.
Figure 14:
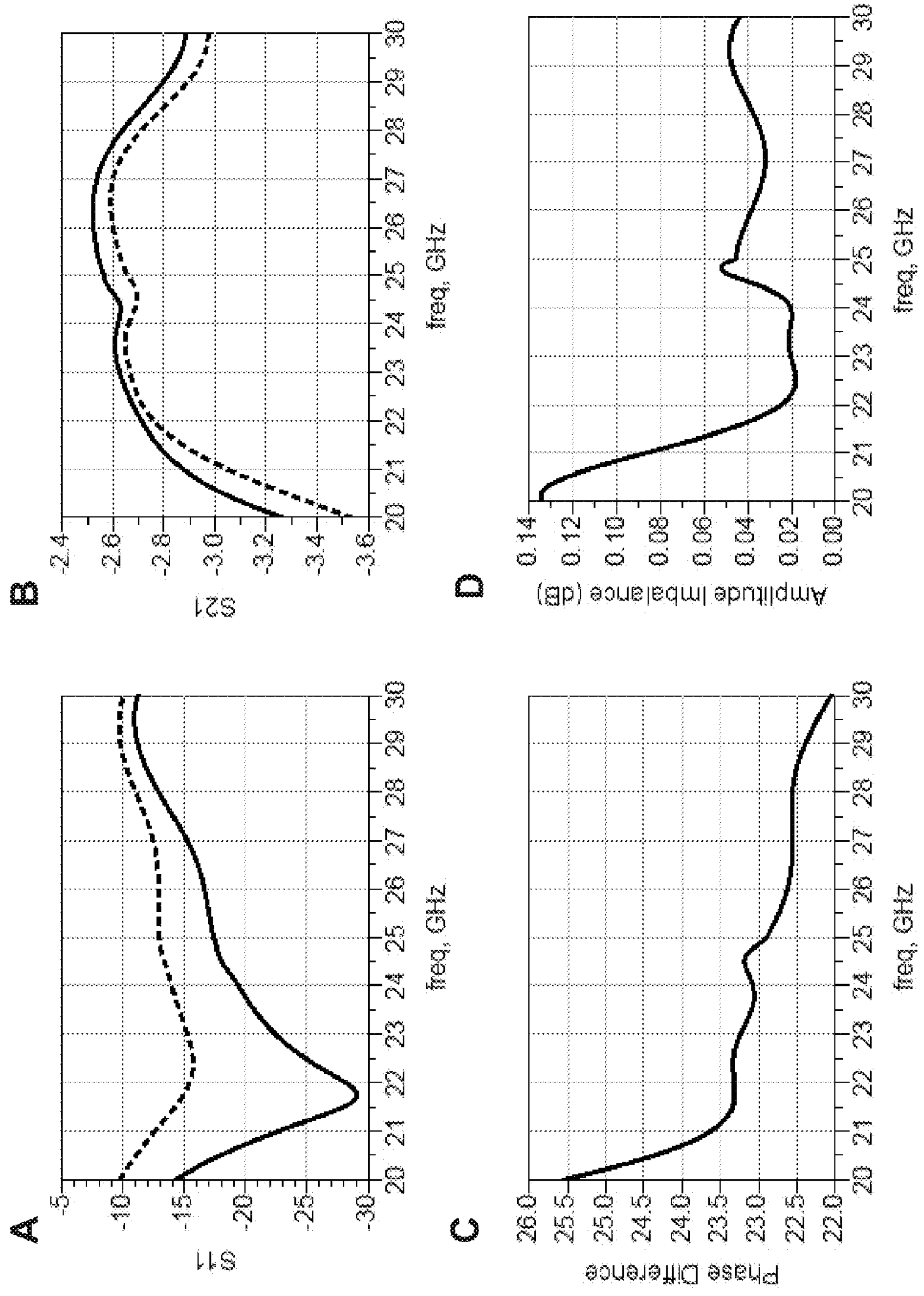
FIGS. 14A-14D are graphs that show the performance of a 22.5° bit of the phase shifter of FIG. 12 in terms of (A) reflection (dB), (B) insertion loss (dB), (C) phase difference, and (D) amplitude imbalance (dB).
Figure 15:
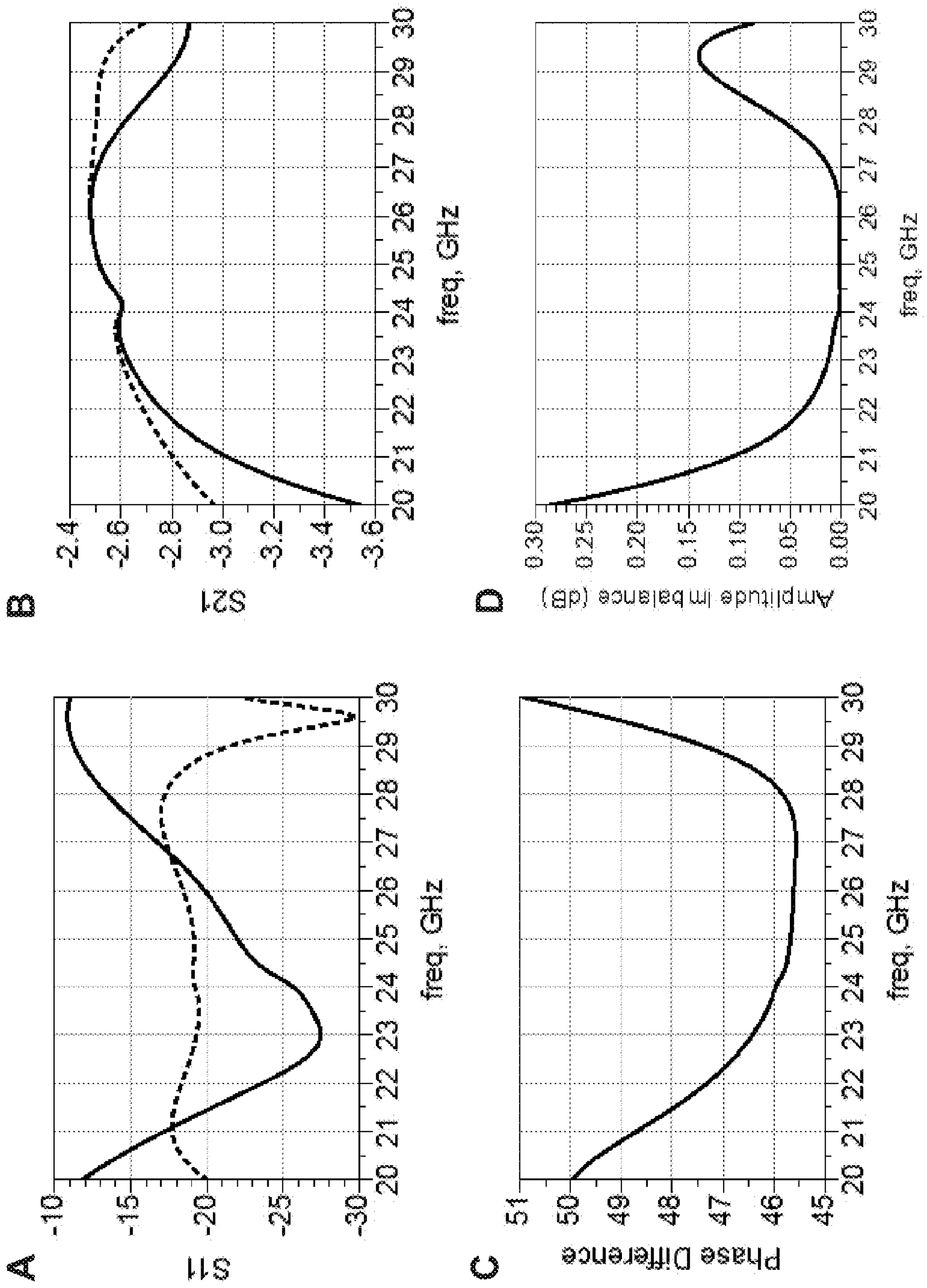
FIGS. 15A-15D are graphs that show the performance of a 45° bit of the phase shifter of FIG. 12 in terms of (A) reflection (dB), (B) insertion loss (dB), (C) phase difference, and (D) amplitude imbalance (dB).
Figure 16:
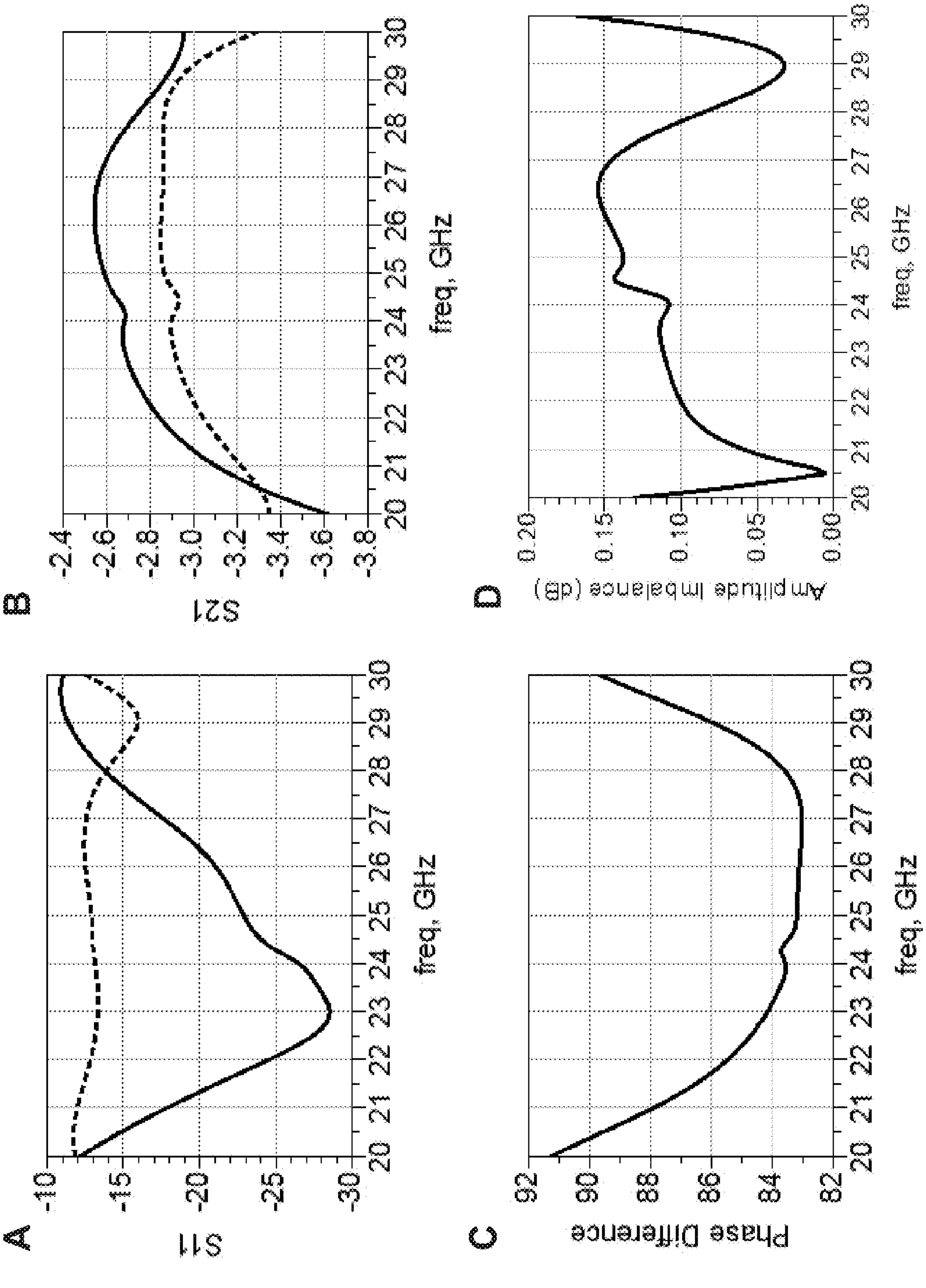
FIGS. 16A-16D are graphs that show the performance of a 90° bit of the phase shifter of FIG. 12 in terms of (A) reflection (dB), (B) insertion loss (dB), (C) phase difference, and (D) amplitude imbalance (dB).
Figure 17:
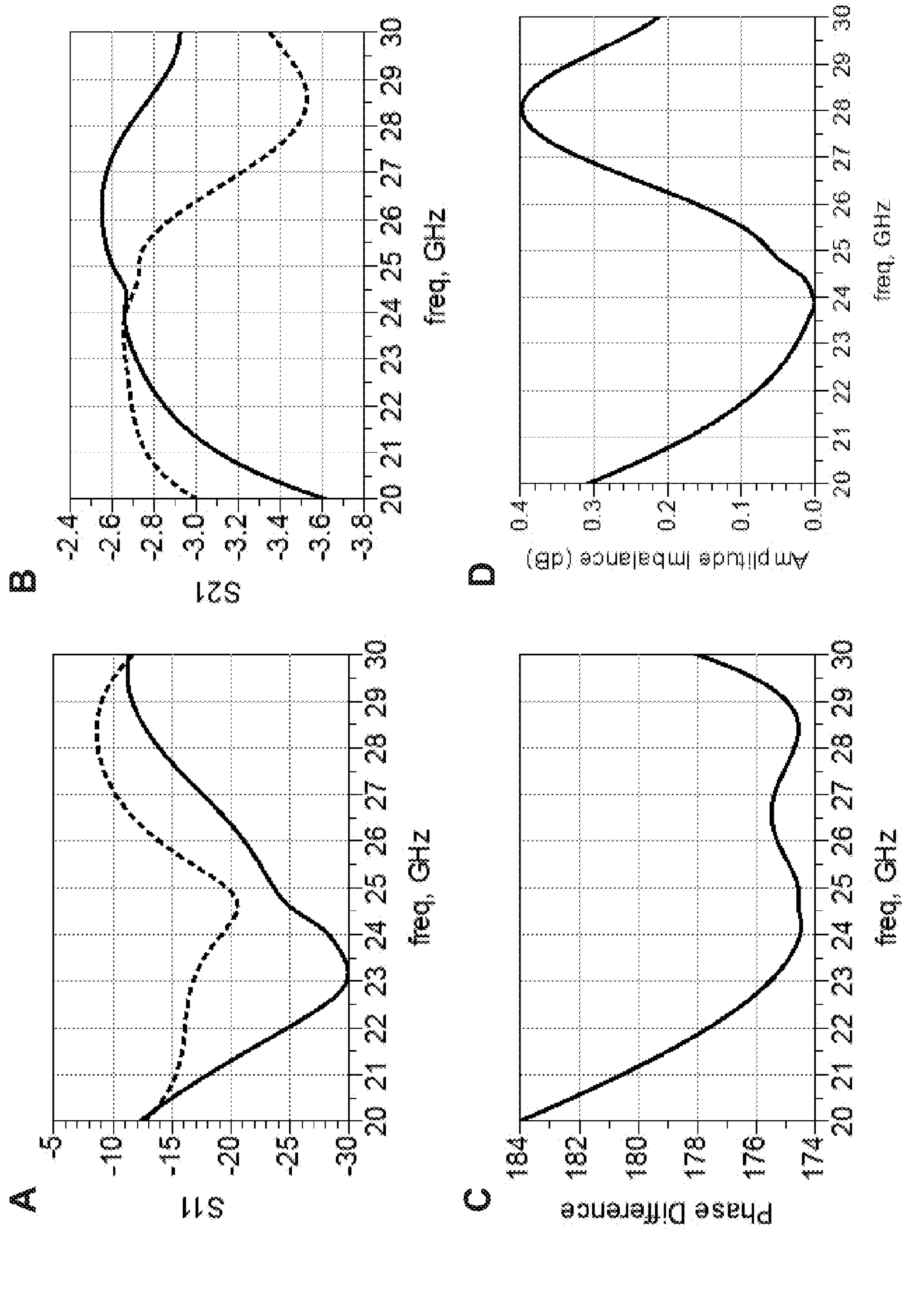
FIGS. 17A-17D are graphs that show the performance of a 180° bit of the phase shifter of FIG. 12 in terms of (A) reflection (dB), (B) insertion loss (dB), (C) phase difference, and (D) amplitude imbalance (dB).

FIG. 13 illustrates an example 4-bit phase shifter 120 that includes multiple series-shunt LC section circuits similar to that shown in FIG. 13. More particularly, FIG. 13 illustrates a phase shifter 120 that includes a 22.5° bit 122, a 45° bit 124, a 90° bit 126, and a 180° bit 128, which are connected to each other in series on a high-resistivity substrate 130. Each of the bits 122-128 is similar in layout to the circuit 50 shown in FIG. 11, although one notable difference is that the 180° bit includes two spirals on both the top and bottom paths of the circuit. By way of example, the phase shifter 120 can occupy an area no greater than approximately 2.5×2.88 $mm^2$ and the substrate can be approximately 60 μm thick.

Simulations were performed on the 4-bit phase shifter layout shown in FIG. 13 and the results of these simulations are provided in FIGS. 14-17. More particularly, FIGS. 14, 15, 16, and 17 identify (A) the reflection (dB), (B) insertion loss (dB), (C) phase variation, and (D) amplitude imbalance (dB) for each of the 22.5° bit, 45° bit, 90° bit, and 180° bit, respectively. In these figures, the solid curves are for the top flow paths and the dashed curves are for the bottom flow paths.

It is noted that the phase shifter's low or high states can be implemented with the higher order CRLH circuits. The network can have a T-network shape, a 7-network shape, or any possible cascades to enhance bandwidth and return loss.

The invention claimed is:

1. A non-dispersive phase shifter comprising:

a composite right- and left-handed (CRLH) circuit that comprises a CRLH unit cell that can be modeled as an inductor in series with a capacitor and a shunt element comprising an inductor and capacitor in parallel, the CRLH unit cell comprising two independent CRLH unit cell circuits that can be alternatively selected, one configured to enable the first state and the other configured to enable the second state, wherein the CRLH circuit can be toggled between a first phase delay state and a second phase delay state with a substantially constant phase shift over a range of frequencies.

2. The phase shifter of claim 1, wherein the phase shift varies within a range of approximately 2 degrees and the range of frequencies is within the range of approximately 20 GHz to 30 GHz.

3. The phase shifter of claim 1, wherein the phase shift varies within a range of approximately 2 degrees and the range of frequencies is approximately 20 GHz to 30 GHz.

4. The phase shifter of claim 1, wherein the inductances and capacitances of the inductors modeled and capacitors each change when the circuit shifts from the first state to the second state and vice versa.

5. The phase shifter of claim 1, wherein the CRLH unit cell comprises a series section and a shunt section.

6. The phase shifter of claim 5, wherein the series section comprises first and second capacitors, an elongated trace, and first and second switches, wherein when the first switch is closed and the second switch is open an input signal travels through the first capacitor, through the first switch, and through the second capacitor, and wherein when the first switch is open and the second switch is closed the signal travels along the elongated trace, through the second switch, and through the second capacitor only.

7. The phase shifter of claim 6, wherein the shunt section comprises a spiral trace and a switch, the spiral trace having an outer loop and an inner loop, wherein when the switch is open, a relatively long path extends between an input of the trace and ground, and wherein when the switch is open, a relatively short path extends between the input and ground.

8. The phase shifter of claim 5, wherein the series section comprises a trace and a capacitor and the shunt section comprises spiral trace.

9. The phase shifter of claim 1, wherein the phase shifter is a multi-bit phase shifter that is configured to shift phase at multiple angles.

10. The phase shifter of claim 1, wherein the phase shifter is a four-bit phase shifter that is configured to shift phase at approximately 22.5 degrees, 45 degrees, 90 degrees, and 180 degrees.

11. The phase shifter of claim 10, wherein the phase shifter comprises four bits, one for each angle.

12. The phase shifter of claim 11, wherein each bit comprises a CRLH unit cell.

13. The phase shifter of claim 10, wherein the phase shifter occupies an area no greater than approximately 2.5×2.88 $mm^2$.

14. A method for introducing variable phase delays to a radio frequency signal, the method comprising:

providing a composite right- and left-handed (CRLH) circuit that comprises a CRLH unit cell that can be modeled as an inductor in series with a capacitor and a shunt element comprising an inductor and capacitor in parallel, the CRLH unit cell including two independent CRLH unit cell circuits that can be alternatively selected, one configured to enable the first state and the other configured to enable the second state; and changing the inductances and capacitances of the modeled inductors and capacitors to shift the circuit from a first phase delay state to a second phase delay state while maintaining a substantially constant phase shift over a range of frequencies.

15. The method of claim 14, wherein the phase shift varies within a range of approximately 2 degrees and the range of frequencies is within the range of approximately 20 GHz to 30 GHz.

* * * * *